(12) United States Patent
Rafique

(10) Patent No.: US 10,979,090 B2
(45) Date of Patent: Apr. 13, 2021

(54) DIGITAL PREDISTORTION FOR ADVANCED ANTENNA SYSTEM

(71) Applicant: Telefonaktiebolaget LM Ericsson (publ), Stockholm (SE)

(72) Inventor: Raihan Rafique, Lund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 16/617,895

(22) PCT Filed: Jun. 1, 2017

(86) PCT No.: PCT/EP2017/063355
§ 371 (c)(1),
(2) Date: Nov. 27, 2019

(87) PCT Pub. No.: WO2018/219466
PCT Pub. Date: Dec. 6, 2018

(65) Prior Publication Data
US 2020/0145033 A1    May 7, 2020

(51) Int. Cl.
*H03F 1/32* (2006.01)
*H04B 1/04* (2006.01)
*H03F 3/24* (2006.01)
*H03F 3/68* (2006.01)

(52) U.S. Cl.
CPC ......... *H04B 1/0475* (2013.01); *H03F 1/3282* (2013.01); *H03F 3/245* (2013.01); *H03F 3/68* (2013.01); *H03F 2200/294* (2013.01); *H03F 2200/451* (2013.01); *H03F 2201/3215* (2013.01); *H03F 2201/3233* (2013.01); *H03F 2203/21106* (2013.01); *H04B 2001/0425* (2013.01)

(58) Field of Classification Search
CPC ............. H03F 1/3247; H03F 2200/451; H03F 1/3282; H03F 3/68; H03F 3/245; H03F 2201/3212; H03F 2201/3215; H03F 2200/294; H04B 1/0475; H04B 7/0842
USPC ................. 375/214, 267, 295–297, 299, 350
See application file for complete search history.

(56) References Cited

U.S. PATENT DOCUMENTS 7,782,132 B2    8/2010    Plotnik et al.
8,803,603 B2    8/2014    Wimpenny
(Continued)

FOREIGN PATENT DOCUMENTS

EP    2629431 B1    10/2017
EP    3255799 A1    12/2017
(Continued)

OTHER PUBLICATIONS

International Search Report and Written Opinion for International Patent Application No. PCT/EP2017/063355, dated Jan. 16, 2018, 10 pages.
(Continued)

*Primary Examiner* — Emmanuel Bayard
(74) *Attorney, Agent, or Firm* — Withrow & Terranova, PLLC

(57) ABSTRACT

Systems and methods are disclosed herein that provide low-complexity Digital Predistortion (DPD) for a transceiver system that uses an Advanced Antenna System (AAS) to provide analog or hybrid beamforming.

13 Claims, 10 Drawing Sheets

(56) References Cited

U.S. PATENT DOCUMENTS

| | | | |
|---|---|---|---|
| 2008/0146168 A1* | 6/2008 | Jesson | H03F 1/3247 455/90.2 |
| 2008/0159435 A1* | 7/2008 | Cohen | H03F 1/3241 375/297 |
| 2010/0093282 A1* | 4/2010 | Martikkala | H04B 17/14 455/63.4 |
| 2010/0166110 A1* | 7/2010 | Neumann | H04L 27/368 375/296 |
| 2010/0311353 A1* | 12/2010 | Teillet | H03F 1/3247 455/84 |
| 2010/0321107 A1* | 12/2010 | Honcharenko | H03F 1/3247 330/124 R |
| 2011/0235734 A1* | 9/2011 | Kenington | H04B 7/0623 375/267 |
| 2011/0235749 A1* | 9/2011 | Kenington | H01Q 3/2605 375/296 |
| 2012/0021691 A1 | 1/2012 | Boe et al. | |
| 2012/0328050 A1* | 12/2012 | Bai | H03F 1/3247 375/297 |
| 2013/0094550 A1* | 4/2013 | Coan | H04L 27/368 375/222 |
| 2015/0103952 A1 | 4/2015 | Wang et al. | |
| 2017/0134210 A1 | 5/2017 | Eitan et al. | |
| 2017/0163217 A1 | 6/2017 | Bonebright et al. | |
| 2018/0026586 A1* | 1/2018 | Carbone | H03F 3/211 330/124 R |
| 2018/0167091 A1* | 6/2018 | Pratt | H04B 1/0475 |
| 2018/0287569 A1* | 10/2018 | Xu | H03F 3/211 |
| 2018/0316367 A1 | 11/2018 | Johansson et al. | |
| 2019/0238204 A1* | 8/2019 | Kim | H04L 27/367 |
| 2020/0028476 A1* | 1/2020 | Kim | H03F 1/3247 |

FOREIGN PATENT DOCUMENTS

| | | |
|---|---|---|
| WO | 2007054609 A1 | 5/2007 |
| WO | 2017198288 A1 | 11/2017 |
| WO | 2018166575 A1 | 9/2018 |
| WO | 2018219466 A1 | 12/2018 |

OTHER PUBLICATIONS

International Search Report and Written Opinion for International Patent Application No. PCT/EP2018/081043, dated Jun. 27, 2019, 9 pages.

* cited by examiner

DIGITAL PREDISTORTION FOR ADVANCED ANTENNA SYSTEM

This application is a 35 U.S.C. § 371 national phase filing of International Application No. PCT/EP2017/063355, filed Jun. 1, 2017, the disclosure of which is incorporated herein by reference in its entirety.

TECHNICAL FIELD

The present disclosure relates to digital predistortion to compensate for, e.g., power amplifier non-linearity and, in particular, relates to digital predistortion for a radio node that utilizes analog or hybrid beamforming.

BACKGROUND

A radio frequency power amplifier is a type of electronic amplifier used to convert a low-power radio frequency signal into a larger signal of significant power, typically for driving the antenna of a transmitter. It is typically optimized to have high efficiency, high output power at the 1 decibel (dB) compression point (P1 dB), good return loss on the input and output, good gain, and optimum heat dissipation.

A radio transmitting in the downlink in a communication system is typically designed to deliver a predefined power level to an antenna, which is in turn designed to radiate in a certain direction to some User Equipment device (UE). In doing so, it is at the same time usually required that the signal has a certain quality, and also, in a system view, required that leakage in adjacent channels/frequencies (spectrum or spatial) is complying with a certain value, either specified by a corresponding standard or sometimes by an official regulation.

The unwanted signal emissions, i.e. the leakage in adjacent channels/frequencies, arise from components in the transmission chain being more or less non-linear, thus causing spectrum broadening. The level of this spectrum broadening may be directly related to the signal quality, regardless of whether the signal is being used as a "wanted signal" or if the signal is being viewed as an interfering signal, i.e. unwanted emissions, to some kind of victim system.

A way to combat these kinds of imperfections, i.e. non-linearities, and ensure that the required level of unwanted emission is kept below a certain limit or value, is to use an analog or digital linearizer to predistort the signal in a proper way so that the unwanted emissions caused by the non-linearity, e.g. of a power amplifier, are canceled in the transmission link. A predistortion circuit inversely models the amplifier's gain and phase characteristics and, when combined with the amplifier, produces an overall system that is more linear and reduces the amplifier's distortion. In essence, "inverse distortion" is introduced into the input of the amplifier, thereby cancelling non-linearities of the amplifier. As radio power amplifiers tend to become more non-linear as their output power increases towards their maximum rated output, predistortion is a way to get more usable power from the amplifier without having to build a larger, less efficient and more expensive amplifier. Linearization, or predistortion, is a very common approach today. This method is also applied in systems having two or more transmission paths, i.e. radios, in parallel, such as in a so-called active (or advanced) antenna array, or Advanced Antenna System (AAS).

However, as the number of active transmitter branches, i.e. transmission paths/radios, increases in an AAS, the complexity of linearizing all of the transmission paths grows dramatically. It is clear that when coming above a certain number of transmitter branches, the processing power and capacity used for the linearizers exceeds the processing power and capacity used for other functionality, and thereby traffic capacity as well as power efficiency can be severely degraded. Further, as the number of active transceiver branches in an AAS increases, the hardware cost and complexity associated with the linearization becomes a problem.

Further, conventional Digital Predistortion (DPD) in a Single Input Single Output (SISO) system requires a significant amount of hardware resources. In a Multiple Input Multiple Output system, linearization is needed to be done for individual transmitter branches. This requires separate DPD hardware for each individual transmitter branch, which is practically difficult if not impossible. Additionally, an analog beam forming system is basically a Single Input Multiple Output (SIMO) system where no direct access to individual power amplifier input is possible.

In a general DPD system, the output signal of a transmitter branch is compared with the corresponding input signal, and the DPD is adapted to minimize the error between the output signal of the transmitter branch and the corresponding input signal. In AAS, this means that each transmitter branch must have a dedicated coupler to enable feedback of its output signal to a receiver. This is because after being fed to the antenna, the output signals from the individual transmitters cannot be distinguished from one another. However, adding an individual coupler for each transmitter branch in an AAS transceiver is space-consuming and the coupling level is comparable to leakage over the circuit board. Also, internal coupling within the transceiver board before the AAS power amplifiers will lead to erroneous DPD. This is due to the fact that the signal at the coupler can be comparable to the internal coupling.

One potential solution for DPD for an AAS transceiver is to perform DPD adaptation for a single transmit branch and then use the same DPD for all transmitter branches. However, when implementing an AAS transceiver, there is always spread in power amplifier performance across the multiple transmitter branches. Also, when performing beam forming and tapering, the gain and phase of the individual transmit branches will be different to give the power amplifiers different operating conditions. Therefore, performing DPD adaptation for a single transmitter branch and then using the same DPD for all transmitter branches may not work in implementation and the adaptation model cannot be generated on-the-fly.

Thus, there is a need for a low-complexity DPD solution for an AAS transceiver.

SUMMARY

Systems and methods are disclosed herein that provide low-complexity Digital Predistortion (DPD) for a transceiver system that uses an Advanced Antenna System (AAS) to provide analog or hybrid beamforming. Embodiments of a transceiver system are disclosed. In some embodiments, the transceiver system comprises a DPD subsystem and an analog or hybrid beamforming front-end. The DPD subsystem is adapted to predistort a baseband transmit signal x(t) in the time domain based on an adaptation model to thereby provide a predistorted baseband transmit signal x'(t). The analog or hybrid beamforming front-end comprises a plurality of transmit branches coupled to a plurality of transmit antenna elements, respectively. The transmit branches are adapted to process the predistorted baseband transmit signal x'(t) to transmit a plurality of radio frequency transmit signals $x_{RF,1}(t)$ through $x_{RF,N}(t)$ via the transmit antenna elements, respectively. The plurality of transmit branches apply a plurality of gain adjustments ($g_1$ through $g_N$) and a plurality of phase adjustments ($\varphi_1$ through $\varphi_N$), respectively, such that each radio frequency transmit signal $x_{RF,i}(t)$ of the plurality of radio frequency transmit signals $x_{RF,1}(t)$ through $x_{RF,N}(t)$ is a radio frequency version of the predistorted baseband transmit signal x'(t) having the gain adjustment ($g_i$) and the phase adjustment ($\varphi_i$) applied by the corresponding transmit branch. The analog or hybrid beamforming front-end further comprises a receive branch, e.g., in cross polarization to the transmit branches, coupled to a receive antenna element, where the receive branch is configured to receive a combined receive signal y(t) comprising the radio frequency transmit signals $x_{RF,1}(t)$ through $x_{RF,N}(t)$ transmitted via the plurality of transmit antenna elements and received via the receive antenna element. The DPD subsystem is further adapted to process the combined receive signal y(t) based on the plurality of gain adjustments ($g_1$ through $g_N$), the plurality of phase adjustments ($\varphi_1$ through $\varphi_N$), and a plurality of known coupling factors ($C_{1,j}$ through $C_{N,j}$) between the plurality of transmit antenna elements and the receive antenna element, respectively, to thereby provide a normalized receive signal $y_{pp}(t)$. The DPD subsystem is further adapted to update the adaptation model based on a comparison of the normalized receive signal $y_{pp}(t)$ and the predistorted baseband transmit signal x'(t).

In some embodiments, the receive branch comprises a low noise amplifier adapted to amplify the combined receive signal y(t) and attenuating circuitry adapted to attenuate the combined receive signal y(t) prior to amplification by the low noise amplifier such that the low noise amplifier operates in a linear mode and thus the receiving element adds a negligible amount of non-linearity.

In some embodiments, in order to process the combined receive signal y(t) to thereby provide the normalized receive signal $y_{pp}(t)$, the DPD subsystem is further adapted to provide the normalized receive signal $y_{pp}(t)$ in accordance with the following equation:

$$y_{pp}(t) = \frac{y(t)}{\sum_{i=1}^{N} g_i e^{j\varphi_i} C_{ij}}$$

where $g_i$ is the gain adjustment applied by the i-th transmit branch, $\varphi_i$ is the phase applied adjustment by the i-th transmit branch, and $C_{ij}$ is the coupling factor between the i-th transmit antenna element and the receive antenna element.

In some embodiments, the DPD subsystem is further adapted to determine whether a measured Adjacent Channel Leakage-power Ratio (ACLR) is acceptable when using the adaptation model, update the adaptation model based on a comparison of the normalized receive signal $y_{pp}(t)$ and the predistorted baseband transmit signal x'(t) if the measured ACLR is not acceptable, and refrain from updating the adaptation model based on a comparison of the normalized receive signal $y_{pp}(t)$ and the predistorted baseband transmit signal x'(t) if the measured ACLR is acceptable.

In some embodiments, the analog or hybrid beamforming front-end is adapted to form a single transmit beam with all of the plurality of transmit antenna elements and the corresponding plurality of transmit branches.

Embodiments of a method for providing DPD in a radio node utilizing an AAS comprising a plurality of antenna elements to provide analog or hybrid beamforming are disclosed. In some embodiments, the method comprises predistorting a baseband input signal x(t) based on an adaptation model to thereby provide a predistorted baseband transmit signal x'(t) and transmitting the predistorted baseband transmit signal x'(t) via a plurality of transmit branches coupled to a plurality of transmit antenna elements, respectively. The plurality of transmit branches apply a plurality of gain adjustments ($g_1$ through $g_N$) and a plurality of phase adjustments ($\varphi_1$ through $\varphi_N$), respectively, such that a plurality of radio frequency transmit signals $x_{RF,1}(t)$ through $x_{RF,N}(t)$ are transmitted via the plurality of transmit antenna elements, respectively, and each radio frequency transmit signal $x_{RF,i}(t)$ is a radio frequency version of the predistorted baseband transmit signal x'(t) having the gain adjustment ($g_i$) and the phase adjustment ($\varphi_i$) applied by the corresponding transmit branch. The method further comprises receiving a combined receive signal y(t) comprising the radio frequency transmit signals $x_{RF,1}(t)$ through $x_{RF,N}(t)$ transmitted via the transmit antenna elements and received via a receive antenna element. The method further comprises processing the combined receive signal y(t) based on the gain adjustments ($g_1$ through $g_N$), the phase adjustments ($\varphi_1$ through $\varphi_N$), and known coupling factors ($C_{1,j}$ through $C_{N,j}$) between transmit antenna elements and the receive antenna element, respectively, to thereby provide a normalized receive signal $y_{pp}(t)$. The method further comprises updating the adaptation model based on a comparison of the normalized receive signal $y_{pp}(t)$ and the predistorted baseband transmit signal x'(t).

In some embodiments, receiving the combined receive signal y(t) comprises attenuating the combined receive signal y(t) prior to amplification by a low noise amplifier such that the low noise amplifier operates in a linear mode.

In some embodiments, processing the combined receive signal y(t) to thereby provide the normalized receive signal $y_{pp}(t)$ comprises providing the normalized receive signal $y_{pp}(t)$ in accordance with the following equation:

$$y_{pp}(t) = \frac{y(t)}{\sum_{i=1}^{N} g_i e^{j\varphi_i} C_{ij}}$$

where $g_i$ is the gain adjustment applied by the i-th transmit branch, $\varphi_i$ is the phase adjustment applied by the i-th transmit branch, and $C_{ij}$ is the coupling factor between the i-th transmit antenna element and the receive antenna element.

In some embodiments, the method further comprises determining whether a measured ACLR is acceptable when using the adaptation model. Further, in some embodiments, updating the adaptation model comprises updating the adaptation module based on a comparison of the normalized receive signal $y_{pp}(t)$ and the predistorted baseband transmit signal x'(t) if the measured ACLR is not acceptable. Further, in some embodiments, the method further comprises refraining from updating the adaptation model based on a comparison of the normalized receive signal $y_{pp}(t)$ and the predistorted baseband transmit signal x'(t) if the measured ACLR is acceptable.

In some embodiments, a single transmit beam is formed with all of the plurality of transmit antenna elements and the corresponding plurality of transmit branches.

Embodiments of a transceiver system for providing DPD in a radio node utilizing an AAS comprising a plurality of antenna elements to provide analog or hybrid beamforming are also disclosed. In some embodiments, the transceiver system is adapted to predistort a baseband input signal x(t) based on an adaptation model to thereby provide a predistorted baseband transmit signal x'(t) and transmit the predistorted baseband transmit signal x'(t) via a plurality of transmit branches coupled to a plurality of transmit antenna elements, respectively. The plurality of transmit branches apply a plurality of gain adjustments ($g_1$ through $g_N$) and a plurality of phase adjustments ($\varphi_1$ through $\varphi_N$), respectively, such that a plurality of radio frequency transmit signals $x_{RF,1}(t)$ through $x_{RF,N}(t)$ are transmitted via the plurality of transmit antenna elements, respectively, and each radio frequency transmit signal $x_{RF,1}(t)$ is a radio frequency version of the predistorted baseband transmit signal x'(t) having the gain adjustment ($g_i$) and the phase adjustment ($\varphi_i$) applied by the corresponding transmit branch. The transceiver system is further adapted to receive a combined receive signal y(t) comprising the plurality of radio frequency transmit signals $x_{RF,1}(t)$ through $x_{RF,N}(t)$ transmitted via the plurality of transmit antenna elements and received via a receive antenna element. The transceiver system is further adapted to process the combined receive signal y(t) based on the plurality of gain adjustments ($g_1$ through $g_N$), the plurality of phase adjustments ($\varphi_1$ through $\varphi_N$), and a plurality of known coupling factors ($C_{1,j}$ through $C_{N,j}$) between the plurality of transmit antenna elements and the receive antenna element, respectively, to thereby provide a normalized receive signal $y_{pp}(t)$. The transceiver system is further adapted to update the adaptation model based on a comparison of the normalized receive signal $y_{pp}(t)$ and the predistorted baseband transmit signal x'(t).

In some embodiments, the transceiver system is further adapted to perform the method of operation of a transceiver according to any one of the embodiments disclosed herein.

In some embodiments, a transceiver system for providing DPD in a radio node utilizing an AAS comprising a plurality of antenna elements to provide analog or hybrid beamforming comprises a predistorting module, a transmitting module, a receiving module, a processing module, and an updating module. The predistorting module is operable to predistort a baseband input signal x(t) based on an adaptation model to thereby provide a predistorted baseband transmit signal x'(t). The transmitting module is operable to transmit the predistorted baseband transmit signal x'(t) via a plurality of transmit branches coupled to a plurality of transmit antenna elements, respectively. The plurality of transmit branches apply a plurality of gain adjustments ($g_1$ through $g_N$) and a plurality of phase adjustments ($\varphi_1$ through $\varphi_N$), respectively, such that a plurality of radio frequency transmit signals $x_{RF,1}(t)$ through $x_{RF,N}(t)$ are transmitted via the plurality of transmit antenna elements, respectively, and each radio frequency transmit signal $x_{RF,j}(t)$ is a radio frequency version of the predistorted baseband transmit signal x'(t) having the gain adjustment ($g_i$) and the phase adjustment ($\varphi_i$) applied by the corresponding transmit branch. The receiving module is operable to receive a combined receive signal y(t) comprising the plurality of radio frequency transmit signals $x_{RF,1}(t)$ through $x_{RF,N}(t)$ transmitted via the plurality of transmit antenna elements and received via a receive antenna element. The processing module is operable to process the combined receive signal y(t) based on the plurality of gain adjustments ($g_1$ through $g_N$), the plurality of phase adjustments ($\varphi_1$ through $\varphi_N$), and a plurality of known coupling factors ($C_{1,j}$ through $C_{N,j}$) between the plurality of transmit antenna elements and the receive antenna element, respectively, to thereby provide a normalized receive signal $y_{pp}(t)$. The updating module is operable to update the adaptation model based on a comparison of the normalized receive signal $y_{pp}(t)$ and the predistorted baseband transmit signal x'(t).

Embodiments of a computer program are also disclosed. In some embodiments, a computer program comprises instructions which, when executed on at least one processor, cause the at least one processor to carry out the method of operation of a transceiver system according to any one of the embodiments disclosed herein. Embodiments of a carrier containing the aforementioned computer program are disclosed, wherein the carrier is one of an electronic signal, an optical signal, a radio signal, or a computer readable storage medium.

Those skilled in the art will appreciate the scope of the present disclosure and realize additional aspects thereof after reading the following detailed description of the embodiments in association with the accompanying drawing figures.

BRIEF DESCRIPTION OF THE DRAWINGS

The accompanying drawing figures incorporated in and forming a part of this specification illustrate several aspects of the disclosure, and together with the description serve to explain the principles of the disclosure.

DETAILED DESCRIPTION

Figure 1:
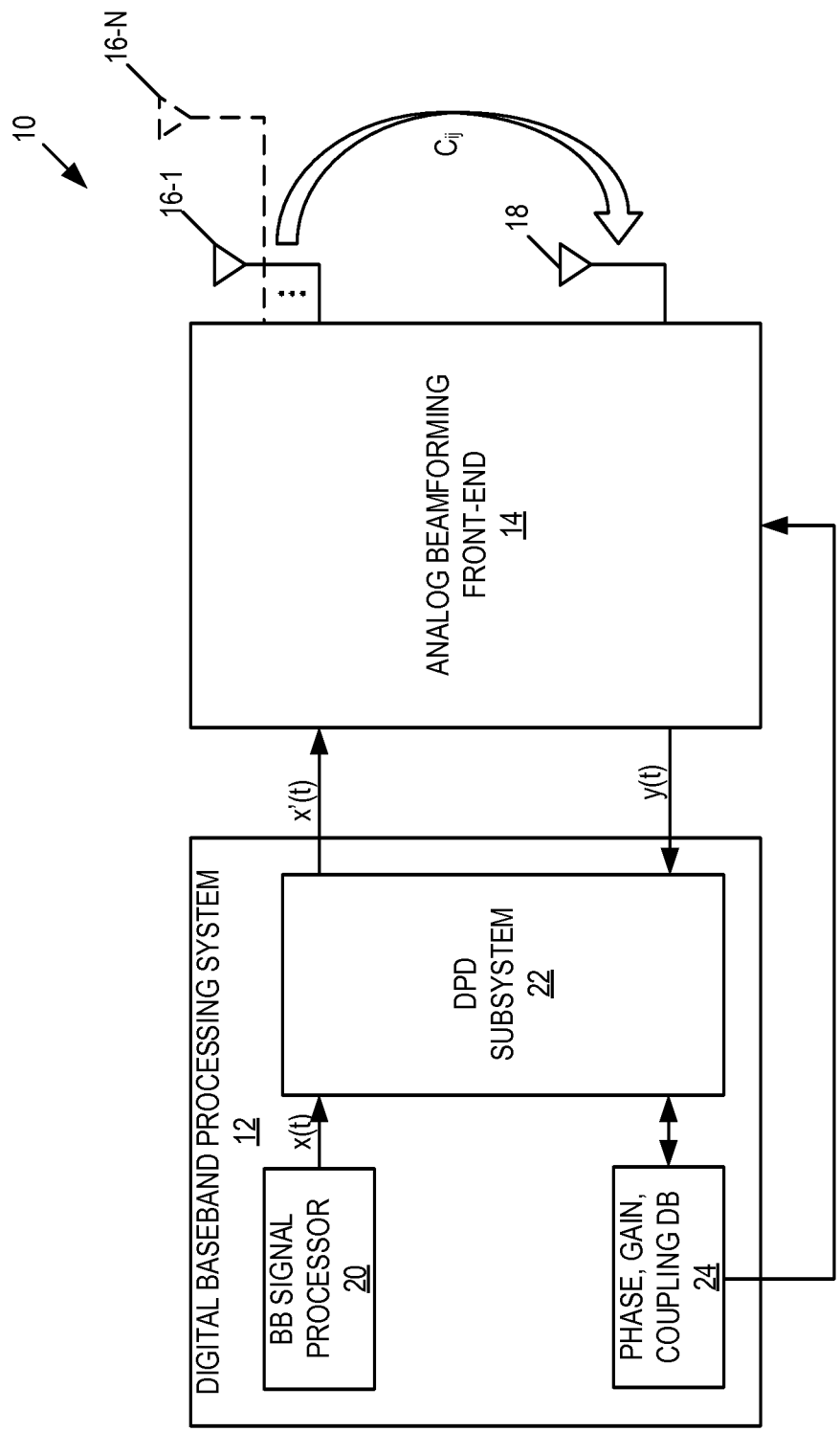
FIG. 1 illustrates one example embodiment of a transceiver system in which embodiments of the present disclosure may be implemented.

The embodiments set forth below represent information to enable those skilled in the art to practice the embodiments and illustrate the best mode of practicing the embodiments.

Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Radio Node:

As used herein, a "radio node" is either a radio access node or a wireless device.

Radio Access Node:

As used herein, a "radio access node" or "radio network node" is any node in a radio access network of a cellular communications network that operates to wirelessly transmit and/or receive signals. Some examples of a radio access node include, but are not limited to, a base station (e.g., a New Radio (NR) base station (gNB) in a Third Generation Partnership Project (3GPP) Fifth Generation (5G) NR network or an enhanced or evolved Node B (eNB) in a 3GPP Long Term Evolution (LTE) network), a high-power or macro base station, a low-power base station (e.g., a micro base station, a pico base station, a home eNB, or the like), and a relay node.

Core Network Node:

As used herein, a "core network node" is any type of node in a core network. Some examples of a core network node include, e.g., a Mobility Management Entity (MME), a Packet Data Network Gateway (P-GW), a Service Capability Exposure Function (SCEF), or the like.

Wireless Device:

As used herein, a "wireless device" is any type of device that has access to (i.e., is served by) a cellular communications network by wirelessly transmitting and/or receiving signals to a radio access node(s). Some examples of a wireless device include, but are not limited to, a User Equipment device (UE) in a 3GPP network and a Machine Type Communication (MTC) device.

Network Node:

As used herein, a "network node" is any node that is either part of the radio access network or the core network of a cellular communications network/system.

Note that the description given herein focuses on a 3GPP cellular communications system and, as such, 3GPP terminology or terminology similar to 3GPP terminology is oftentimes used. However, the concepts disclosed herein are not limited to a 3GPP system.

Note that, in the description herein, reference may be made to the term "cell;" however, particularly with respect to 5G NR concepts, beams may be used instead of cells and, as such, it is important to note that the concepts described herein are equally applicable to both cells and beams. Note that the embodiments disclosed herein relate to generating and using an adaptation model for predistortion for a single beam (i.e., for a single beam direction). The embodiments discussed herein can be extended to generate and use adaptation models for multiple beams.

There is a need for a low complexity Digital Predistortion (DPD) system for a transceiver system (e.g., a Multiple Input Multiple Output (MIMO) transceiver) using an Advanced, or Active, Antenna System (AAS) having a multitude of active antenna branches (i.e., antenna elements coupled to active transmitter branches). This is achieved by embodiments described herein, and defined by the appended set of claims. The embodiments enable linearization of a multitude of power amplifiers in parallel transmitter branches coupled to corresponding antenna elements in the AAS using only one linearizer (e.g., only one DPD subsystem). In other words, the embodiments described herein enable the use of considerably less linearizers than the number of transmitter branches. The power amplifiers may all be different in their non-linear characteristics.

A large advantage of embodiments described herein is the possibility to use, e.g., only one DPD subsystem (i.e., a single digital predistorter) for a whole antenna array coupled to multiple parallel transmitter branches each having its own amplifiers without the need to predistort the input signal of each amplifier separately. The advantage lies primarily in the reduction of the complexity of DPD for a radio node utilizing an AAS with multiple parallel transmitter branches having their own amplifiers that potentially have different non-linear characteristics.

Embodiments described herein are related to DPD for a transceiver system (e.g., a MIMO transceiver) using an AAS having parallel transmitter branches. In particular, embodiments described herein relate to performing a single DPD (i.e., a single linearization) for multiple parallel transmitter branches. The transmitter branches include respective power amplifiers that may be more-or-less identical or may be different in their performance. Each transmitter branch is connected to a respective antenna element of the AAS and radiated to create a desired beam. Each transmitter branch may have its own phase and gain control. The number of digital baseband inputs to the DPD subsystem is one in the case of analog beamforming.

Systems and methods are described herein for DPD for a transceiver system using an AAS having multiple parallel transmitter branches. In particular, the transmitter system provides analog or hybrid beamforming using the parallel transmitter branches, each coupled to a respective antenna element of the AAS. The antenna elements to which the transmitter branches are coupled are referred to herein as transmit antenna elements. In addition, the transceiver system includes a receiver, which is sometimes referred to herein as a measurement receiver or measurement receiver branch, coupled to an antenna element of the AAS, which is referred to herein as a receive antenna element. The measurement receiver branch is used to receive transmit signals transmitted via the transmitter branches for purposes of DPD adaptation. The measurement receiver branch could be a part of the same AAS transceiver as the transmitter branches or be an additional receiver added for purposes of measurement for DPD adaptation. The coupling between the receive antenna element and the different transmit antenna elements could be the same or different. However, the measurement receiver branch receives a combined signal from all of the transmitter branches subject to the coupling between the receive antenna element and the different transmit antenna elements.

In some embodiments, DPD is performed using a Volterra series of the baseband transmit signal in digital baseband. Then, the Volterra series is predistorted using an inverse of an adaptation model. The adaptation model is a model of the combined non-linearity of the multiple parallel transmitter branches. The adaptation model is created and updated based on a comparison of the predistorted baseband transmit signal and a normalized version of the combined receive signal.

In a calibrated AAS system, the phase and gain adjustment values of the different transmitter branches are readily available. This is because these values were previously obtained (e.g., computed or otherwise determined) to provide the desired beamforming. For example, the phase and gain value may be obtained from a Look Up Table (LUT).

While the embodiments disclosed herein provide numerous advantages, some examples are as follows. At least some embodiments provide DPD for a transceiver system that uses an AAS using a single DPD subsystem (i.e., a single DPD hardware block). In other words, separate, parallel DPD subsystems are not needed for the parallel transmitter branches. The DPD suppresses Adjacent Channel Leakage-Power Ratio (ACLR). Further, embodiments of the present disclosure may be integrated with the analog or hybrid synthesis process and further enable dynamic beamforming. Still further, embodiments of the present disclosure enable DPD adaptation without the need for couplers between the outputs of the parallel transmitter branches and the measurement receiver branch.

In this regard, FIG. 1 illustrates one example embodiment of a transceiver system 10 in which embodiments of the present disclosure may be implemented. As illustrated, the transceiver system 10 includes a digital baseband processing system 12 and an analog beamforming front-end 14 coupled to an AAS including multiple antenna elements 16, 18. Note that while the analog beamforming front-end 14 is, in this example, an analog beamforming front-end, the beamforming front-end may alternatively be a hybrid beamforming front-end (i.e., the embodiments described herein are applicable to both an analog beamforming front-end and a hybrid beamforming front-end). In this example, at least one antenna element 16-1 and potentially multiple antenna elements 16-1 through 16-N are coupled to respective transmitter branches within the analog beamforming front-end 14. As such, the antenna elements 16-1 through 16-N are referred to herein as transmit antenna elements 16-1 through 16-N. Similarly, an antenna element 18 of the AAS is coupled to a receiver branch, e.g., in cross polarization to the transmitter branches, within the analog beamforming front-end 14 and, as such, is referred to as a receive antenna element 18. Note that the transmit antenna elements 16-1 through 16-N and the receive antenna element 18 may be statically configured or dynamically configured depending on the particular implementation. For example, the particular antenna elements of the AAS used as the transmit antenna elements 16-1 through 16-N may change over time; likewise, the particular antenna element of the AAS used as the receive antenna element 18 may change over time.

The digital baseband processing system 12 is implemented in hardware or a combination of hardware and software. For instance, the digital baseband processing system 12 may be implemented using one or more processors (e.g., Central Processing Units (CPUs), Digital Signal Processors (DSPs), Application Specific Integrated Circuits (ASICs), Field Programmable Gate Arrays (FPGAs), and/or the like). Further, some or all of the functionality of the digital baseband processing system 12 may be implemented in software executed by the processor(s).

The digital baseband processing system 12 includes a baseband signal processor 20, a DPD subsystem 22, and a database 24 or other data store (e.g., a LUT). In operation, the baseband signal processor 20 generates a baseband transmit signal x(t). The DPD subsystem 22 digitally pre-distorts the Volterra coefficients of the baseband transmit signal x(t) to provide a predistorted baseband transmit signal x'(t) based on an adaptation model (e.g., by multiplying the baseband transmit signal by the inverse of the adaptation model). The adaptation model is a model of the (combined) non-linearity of the transmitter branch(es) of the analog beamforming front-end 14. The predistorted baseband transmit signal x'(t) is provided to the analog beamforming front-end 14 for transmission via the transmit antenna element 16-1 or transmit antenna elements 16-1 through 16-N, depending on the particular embodiment. The transmitted signal(s) is(are) received at the receive antenna element 18 and processed by the analog beamforming front-end 14 to provide a (combined) baseband receive signal y(t). As discussed below in detail, the DPD subsystem 22 post-processes the (combined) baseband receive signal y(t) to account for the gain and phase adjustments in the transmitter branch(es) of the analog beamforming front-end 14 as well as the coupling factor(s) between the transmit antenna element(s) 16 and the receive antenna element 18 to thereby provide a normalized baseband receive signal. The DPD subsystem 22 compares Volterra coefficients of the normalized baseband receive signal (referred to herein as ypp(t)) to the corresponding predistorted baseband transmit signal x'(t) to create or update the adaptation model. In general, the adaptation model is generated to reduce (e.g., minimize) the error between the normalized baseband receive signal to the corresponding predistorted baseband transmit signal x'(t). In this manner, a single DPD is performed to provide linearization of multiple parallel transmitter branches of the analog beamforming front-end 14.

The transceiver system 10 provides a DPD solution for the AAS (i.e., for a multi-antenna system). This DPD solution is for an analog beamforming AAS; therefore, there is only one main beam direction using all of the transmitter branches of the analog beamforming front-end 14. In an analog beamforming AAS, the expected power amplifier behavior is identical across the multiple transmitter branches of the analog beamforming front-end 14. However, in actual implementation, there is always spread (i.e., there are always differences between the behavior and, in particular, the non-linearity of the power amplifiers). Additionally, for beam forming, the output power of individual power amplifiers may vary, which means that not all power amplifiers are operating in the same linear region. Here, the DPD subsystem 22 performs a single DPD based on an adaptation model that is configured to compensate for the different non-linear characteristics of the multiple transmit branches of the analog beamforming front-end 14.

As discussed below in detail, the DPD subsystem 22 creates and updates the adaptation model based on the (combined) receive signal y(t), where the (combined) receive signal y(t) is obtained using a measurement receiver branch within the analog beamforming front-end 14 and a corresponding receive antenna element 18 of the AAS. In this manner, there is no need for a coupler (i.e., for coupler circuitry) to couple the output(s) of the transmitter branch(es) to the input of the measurement receiver branch. When multiple transmitter branches are active, the combined receive signal y(t) is a combination of all of the transmitted signals including corresponding gain, phase, and coupling variations. The gain and phase adjustments of the transmit branches are known and stored in the database 24. Likewise, the coupling factors $C_{ij}$ (for i=1 ... N) between the transmit antenna elements 16 and the receive antenna element 18 (represented by index j) are also known and stored in the database 24. The coupling factors $C_{ij}$ may be determined, e.g., using any suitable antenna calibration procedure.

In order to generate the adaptation model used by the DPD subsystem 22 for predistortion, either one transmitter branch or multiple transmitter branches can be used, depending on the particular embodiment. The details of these embodiments are described below.

Figure 2:
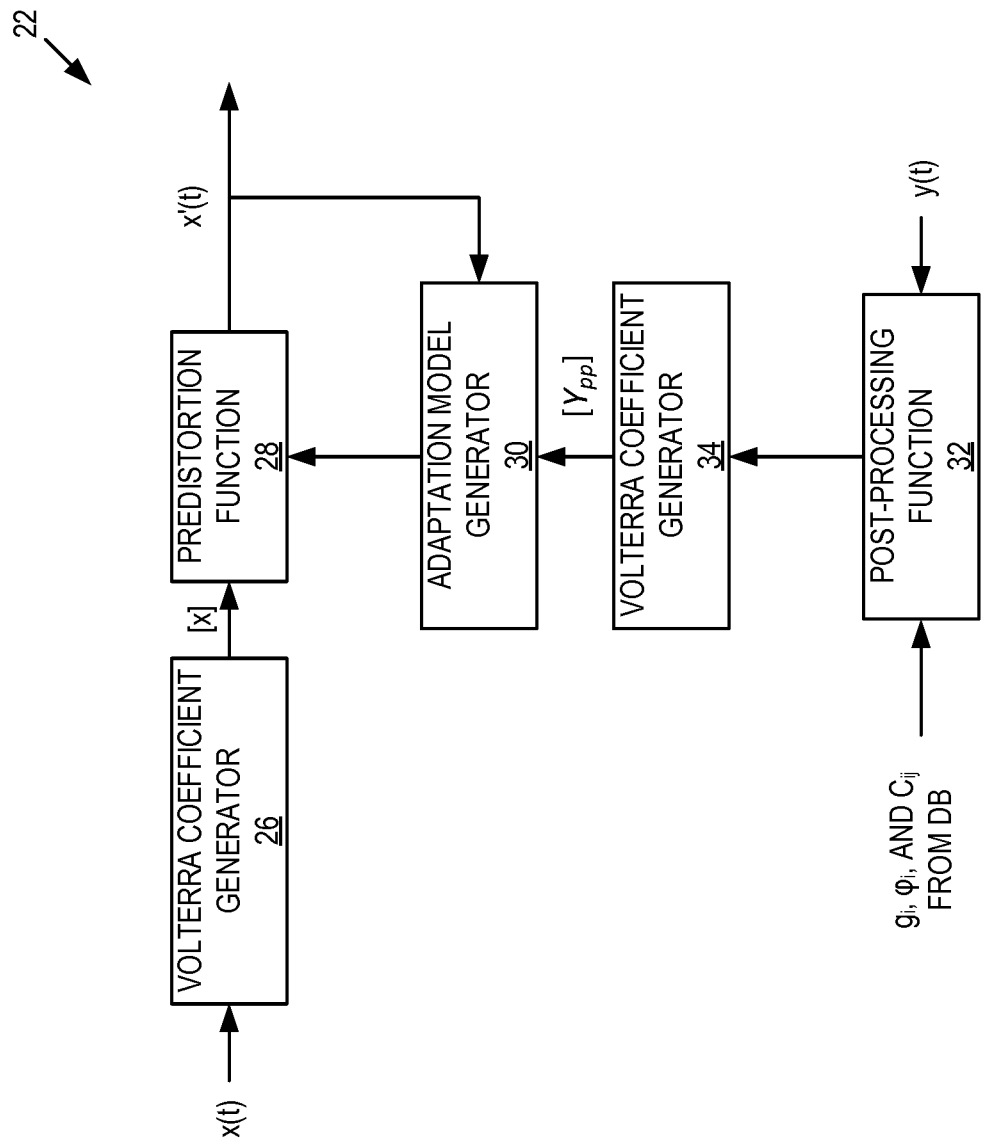
FIG. 2 illustrate one example of a Digital Predistortion (DPD) subsystem according to embodiments of the present disclosure.

FIG. 2 illustrates one example of the DPD subsystem 22 according to embodiments of the present disclosure. As illustrated, the DPD subsystem 22 includes a first Volterra series coefficient generator 26, a predistortion function 28, an adaptation model generator 30, a post-processing function 32, and a second Volterra series coefficient generator 34. In this example, in order to digitally predistort the baseband transmit signal x(t), the first Volterra series coefficient generator 26 generates a Volterra series, as represented by the Volterra coefficients, from the baseband transmit signal x(t). The Volterra series is then passed to the predistortion function 28, which processes the Volterra series based on the adaptation model generator 30 to provide the predistorted baseband transmit signal x'(t). The predistorted baseband transmit signal x'(t) is fed back to the adaptation model generator 30 and used to generate or update the adaptation model.

In addition, the (combined) receive signal y(t) is fed back to the post-processing function 32 from the analog beamforming front-end 14. The expected combined linear signal y(t) to be received can be expressed as:

$$y(t) = x(t) \sum_{i=1}^{N} (g_i e^{j\varphi_i} C_i) \quad (1)$$

where $g_i$ is a gain adjustment applied by the i-th transmitter branch, $\varphi_i$ is a phase adjustment applied by the i-th transmitter branch, and $C_i$ is a coupling factor for the coupling between the i-th transmit antenna element (which is coupled to the output of the i-th transmitter branch) and the receive antenna element (which is coupled to the input of the measurement receiver branch). Note that error/noise is considered as being part of the non-linearity. Further, in some scenarios or implementations, the gain adjustments $g_i$ may be the same for all of the transmitter branches. For a single transmitter branch, Equation (1) reduces to:

$$y(t) = x(t) g_i e^{j\varphi_i} C_i \quad (2)$$

The post-processing function 32 processes the combined receive signal y(t) to effectively remove the combined effects of the gain adjustments $g_i$ and phase adjustments $\varphi_i$ of the transmitter branches and the coupling factors $C_i$ between the transmit antenna elements 16 and the receive antenna element 18. Specifically, the post-processing function 32 computes a normalized, or post-processed, receive signal as:

$$y_{pp}(t) = \frac{y(t)}{\sum_{i=1}^{N} g_i e^{j\varphi_i} C_{ij}} \quad (3)$$

The second Volterra series coefficient generator 34 generates a Volterra series, represented as Volterra coefficients, for the normalized receive signal $y_{pp}(t)$. The adaptation model generator 30 then updates the adaptation model as follows:

$$h_q = h_{q-1} \frac{[X]}{[Y_{pp}]} \quad (4)$$

where $h_q$ is the updated adaptation model, $h_{q-1}$ is the previous adaptation model, [X] is the set of Volterra coefficients representing the baseband transmit signal x(t), and $[Y_{pp}]$ is the set of Volterra coefficients representing the normalized receive signal $y_{pp}(t)$.

Figure 3:
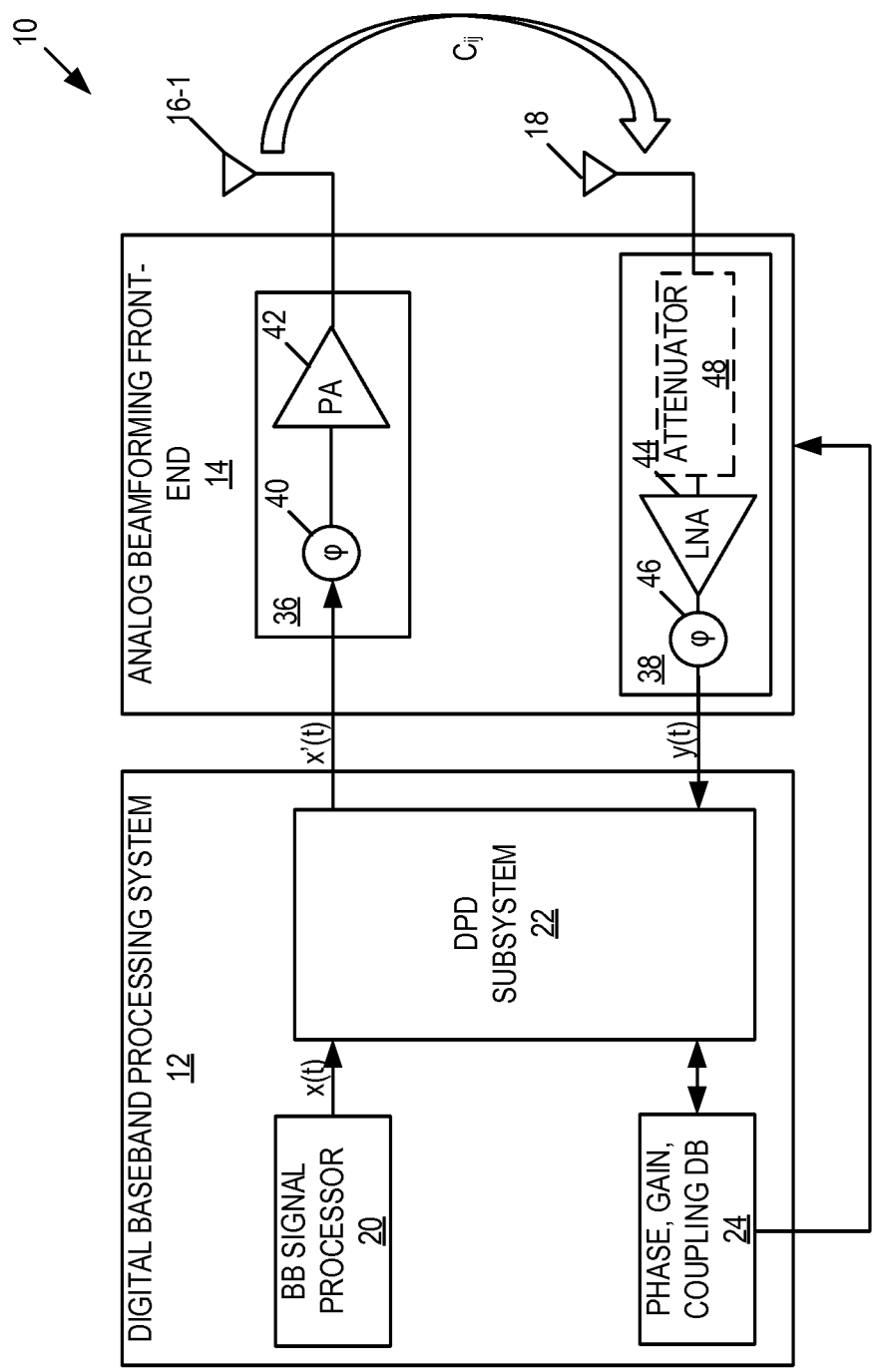
FIG. 3 illustrates an embodiment the transceiver system of FIG. 1 in which only one transmitter branch is used to generate an adaptation model used by the DPD subsystem for predistortion.

As discussed above, in some embodiments, only one transmitter branch is used to generate the adaptation model used by the DPD subsystem 22 for predistortion. Here, it is assumed that the non-linearity of all of the transmitter branches is identical or that any differences are negligible. As such, the adaptation model can be created and updated using only one transmitter branch and one transmit antenna element. In this regard, FIG. 3 illustrates an embodiment of the transceiver system 10 in which only one transmitter branch 36 is used to generate the adaptation model used by the DPD subsystem 22 for predistortion. Notably, the analog beamforming front-end 14 includes multiple transmitter branches; however, only one of those transmitter branches is used as the transmitter branch 36 to generate the adaption model used by the DPD subsystem 22 for predistortion at any one time. The particular transmitter branch used as the transmitter branch 36 may or may not vary over time. In addition, a measurement receiver branch 38 is used to receive the signal transmitted by the transmitter branch 36 via coupling between the transmit antenna element 16-1 and the receive antenna element 18. As illustrated, the transmitter branch 36 includes a phase adjuster 40 that applies the phase adjustment φ for the transmitter branch 36 and a power amplifier (PA) 42 that applies a gain adjustment g for the transmitter branch 36. The measurement receiver branch 38 includes a Low Noise Amplifier (LNA) 44, a phase adjuster 46, and an optional attenuator 48. Note that the phase adjuster 46 is an intrinsic part of beamforming and is taken into account in post-processing. Specifically, cross-correlation is done of the normalized output signal after post-processing. In some embodiments, the attenuator 48 operates to attenuate the receive signal y(t) such that the LNA 44 operates in its linear region so that the LNA 44 introduces negligible non-linearity into the signal path. While not illustrated for clarity and ease of discussion, as one of skill in the art will readily appreciate, the transmitter branch 36 and the measurement receiver branch 38 also include various components used for transmission and reception (e.g., an upconverter for upconverting to radio frequency, a downconverter for downconverting from radio frequency to baseband, filters, etc.).

Figure 4:
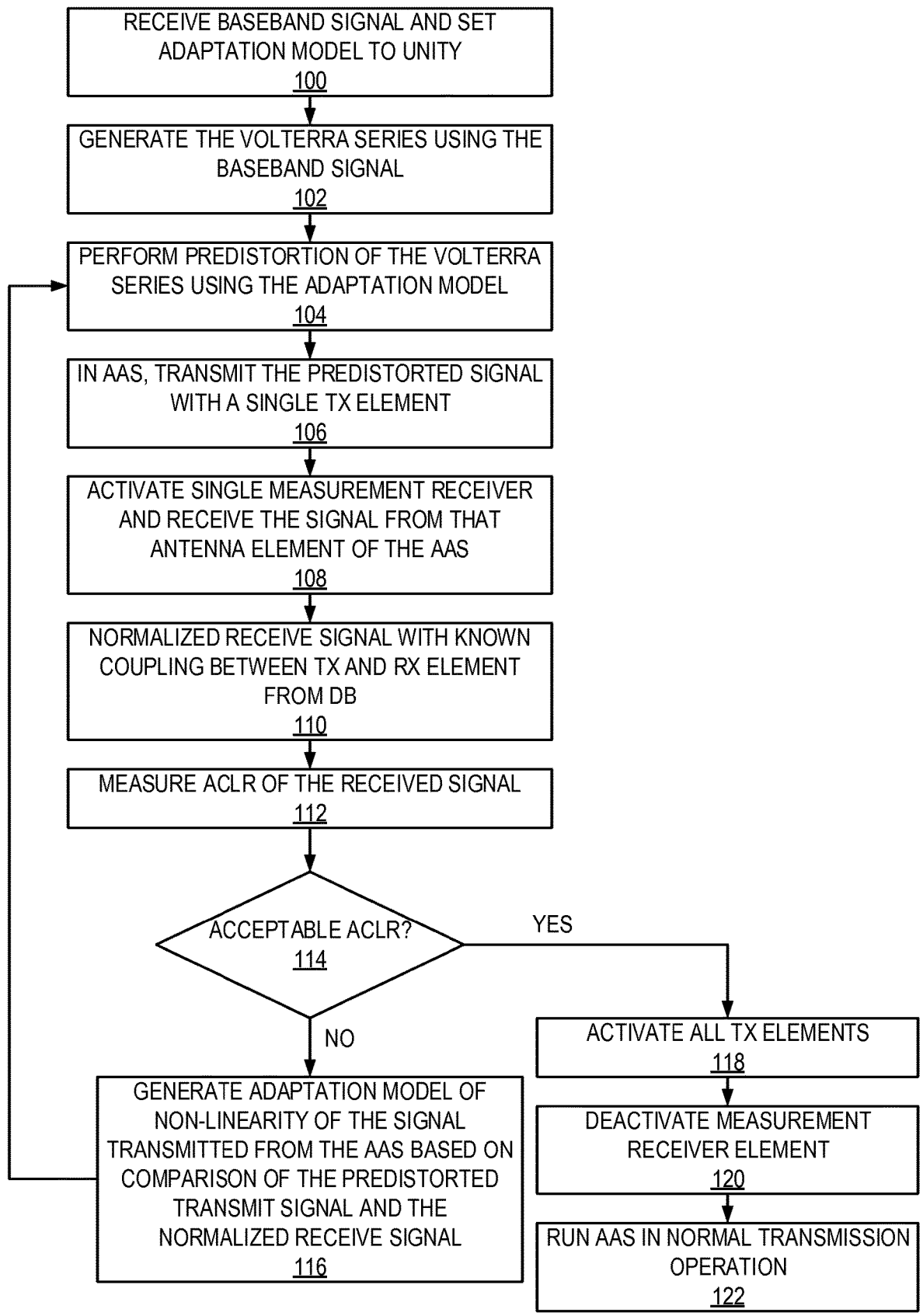
FIG. 4 is a flow chart that illustrates the operation of the transceiver system of FIG. 3 according to some embodiments of the present disclosure.

FIG. 4 is a flow chart that illustrates the operation of the transceiver system 10 of FIG. 3. As illustrated, the DPD subsystem 22 receives the baseband transmit signal x(t) (step 100). For the first iteration (i.e., when originally generating the adaptation model), the DPD subsystem 22 initializes the adaptation model to unity. In some embodiments, the baseband transmit signal x(t) is a specific test signal having the same dynamic range of an actual signal that is to be transmitted by the transceiver system 10 during normal operation. The DPD subsystem 22 predistorts the baseband transmit signal x(t) based on the adaptation model. More specifically, in this example, the first Volterra series coefficient generator 26 generates a Volterra series, which is represented by a set of Volterra coefficients, for the baseband transmit signal x(t) (step 102), and the predistortion function 28 performs predistortion of the Volterra series (and thus the baseband transmit signal x(t)) using the adaptation model (step 104). The predistorted baseband transmit signal x'(t) is provided to the analog beamforming front-end 14. The transmitter branch 36 transmits the predistorted baseband transmit signal x'(t) via a single transmit antenna element 16-1 (step 106). A single measurement receiver branch 38 is activated, and the measurement receiver branch 38 receives a receive signal y(t) that corresponds to the signal transmitted via the single transmit antenna element 16-1 (step 108). The post-processing function 32 normalizes the receive signal y(t) using the known coupling between the transmit antenna element 16-1 and the receive antenna element 18 as well as the known phase and gain adjustments of the transmitter branch 36, as discussed above (step 110).

In this example, the DPD subsystem 22 measures ACLR of the received signal y(t) or, alternatively, the normalized receive signal $y_{pp}(t)$ (step 112) and determines whether the measured ACLR is acceptable (i.e., whether the measured ACLR is at or below a defined acceptable ACLR level) (step 114). The acceptable ACLR level may be defined by, e.g., a regulation promulgated by a regulatory agency and may vary from one country or region to another. If the measured ACLR is not at an acceptable level (step 114, NO), the DPD subsystem 22 generates, or updates, the adaptation model based on a comparison of the predistorted baseband transmit signal x'(t) and the normalized receive signal $y_{pp}(t)$, as discussed above (step 116). The process then returns to step 104 and is repeated. Once the ACLR is at an acceptable level (step 114, YES), further updating of the adaptation model ceases, and, in this example, the digital baseband processing system 12 activates all transmitter branches and corresponding transmit antenna elements 16, deactivates the receive antenna element 18 and the measurement receiver branch 38, and begins operating in a normal transmission mode of operation (steps 118 through 122).

Figure 5:
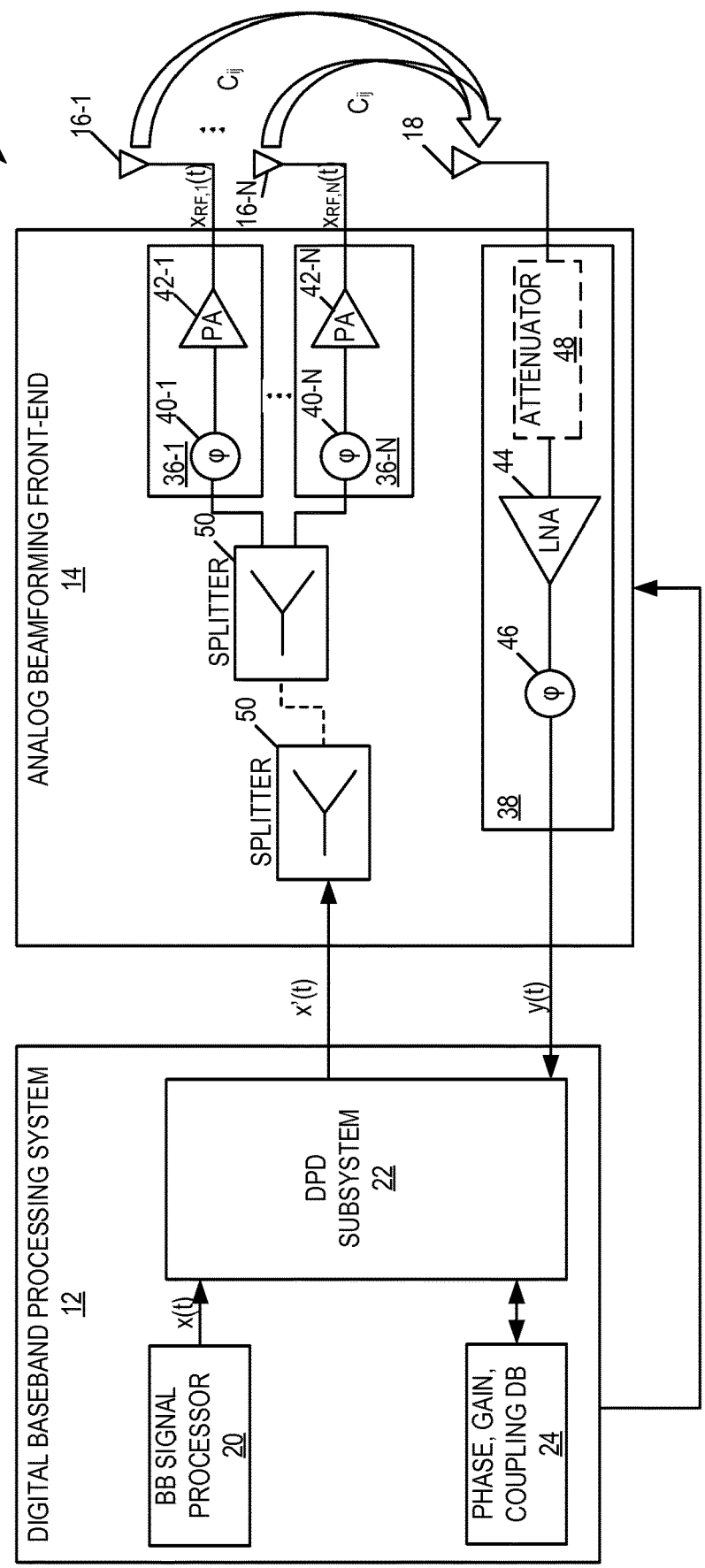
FIG. 5 illustrates an embodiment the transceiver system of FIG. 1 in which multiple transmitter branches are used to generate an adaptation model used by the DPD subsystem for predistortion.

As discussed above, in some embodiments, only one transmitter branch is used to generate the adaptation model used by the DPD subsystem 22 for predistortion. In this regard, FIG. 5 illustrates an embodiment of the transceiver system 10 in which multiple transmitter branches 36-1 through 36-N are used to generate the adaptation model used by the DPD subsystem 22 for predistortion. Notably, the analog beamforming front-end 14 includes many transmitter branches. The transmitter branches 36-1 through 36-N may be all of the transmitter branches of the analog beamforming front-end 14 or some subset thereof. If only a subset, then the subset of the transmitter branches used as the transmitter branches 36-1 through 36-N to generate the adaption model used by the DPD subsystem 22 may or may not vary over time. In addition, a measurement receiver branch 38 is used to receive the signal transmitted by the transmitter branches 36-1 through 36-N via coupling between the respective transmit antenna elements 16-1 through 16-N and the receive antenna element 18. Because of the physical location and corresponding variation in distance between the transmit antenna elements 16-1 through 16-N and the receive antenna element 18, the coupling is different for different transmit antenna elements 16-1 through 16-N for a given receive antenna element 18. As illustrated, the transmitter branches 36-1 through 36-N include phase adjusters 40-1 through 40-N that apply the phase adjustment γ for the transmitter branch and PAs 42-1 through 42-N that apply a gain adjustment g for the transmitter branch 36. The measurement receiver branch 38 includes a LNA 44, a phase adjuster 46, and an optional attenuator 48. In some embodiments, the attenuator 48 operates to attenuate the receive signal y(t) such that the LNA 44 operates in its linear region so that the LNA 44 introduces negligible non-linearity into the signal path.

As illustrated, splitter circuitry 50 operates to provide the same predistorted baseband transmit signal x'(t) to each of the transmitter branches 36-1 through 36-N. The transmitter branches 36-1 through 36-N include phase adjusters 40-1 through 40-N that apply the phase adjustments $\varphi_1$ through $\varphi_N$ for the transmitter branches 36-1 through 36-N, respectively, and PAs 42-1 through 42-N that apply gain adjustments $g_1$ through $g_N$ for the transmitter branches 36-1 through 36-N, respectively. As discussed above, the measurement receiver branch 38 includes the LNA 44 and the phase adjuster 46 and, optionally, the attenuator 48. While not illustrated for clarity and ease of discussion, as one of skill in the art will readily appreciate, the transmitter branches 36-1 through 36-N and the measurement receiver branch 38 also include various components used for transmission and reception (e.g., upconverters for upconverting to radio frequency, downconverters for downconverting from radio frequency to baseband, filters, etc.). In operation, the transmitter branches 36-1 through 36-N process the predistorted baseband transmit signal x'(t) to provide respective radio frequency transmit signals $x_{RF,1}(t)$ through $x_{RF,N}(t)$.

Figure 6:
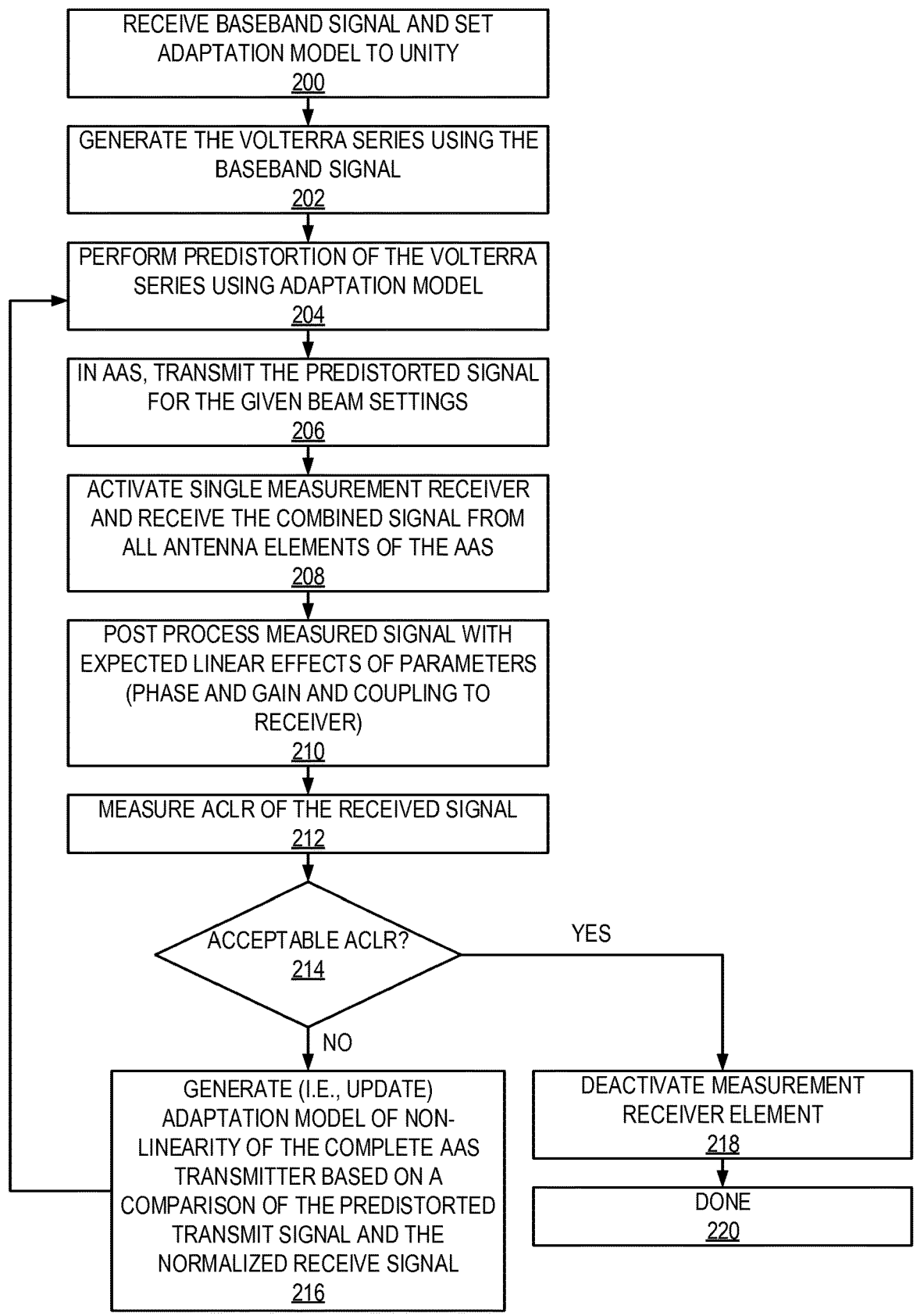
FIG. 6 is a flow chart that illustrates the operation of the transceiver system of FIG. 5 according to some embodiments of the present disclosure.

FIG. 6 is a flow chart that illustrates the operation of the transceiver system 10 of FIG. 5 according to some embodiments of the present disclosure. As illustrated, the DPD subsystem 22 receives the baseband transmit signal x(t) (step 200). For the first iteration (i.e., when originally generating the adaptation model), the DPD subsystem 22 initializes the adaptation model to unity. In some embodiments, the baseband transmit signal x(t) is an actual signal that is to be transmitted by the transceiver system 10 during normal operation. In this manner, the DPD model is generated or updated using a "live" signal. The DPD subsystem 22 predistorts the baseband transmit signal x(t) based on the adaptation model. More specifically, in this example, the first Volterra series coefficient generator 26 generates a Volterra series, which is represented by a set of Volterra coefficients, for the baseband transmit signal x(t) (step 202), and the predistortion function 28 performs predistortion of the Volterra series (and this the baseband transmit signal x(t)) using the adaptation model (step 204). The predistorted baseband transmit signal x'(t) is provided to the analog beamforming front-end 14. The transmitter branches 36-1 through 36-N transmit the predistorted baseband transmit signal x'(t) for a given set of beam settings (e.g., for a given beam direction) (step 206). A single measurement receiver branch 38 is activated, and the measurement receiver branch 38 receives a combined receive signal y(t) that corresponds to the combination of the signals transmitted via the transmit antenna elements 16-1 through 16-N (step 208). The post-processing function 32 normalizes the combined receive signal y(t) using the known coupling factors between the transmit antenna elements 16-1 through 16-N and the receive antenna element 18 as well as the known phase and gain adjustments of the transmitter branches 36-1 through 36-N, as discussed above (step 210).

In this example, the DPD subsystem 22 measures ACLR of the received signal y(t) or, alternatively, the normalized received signal $y_{pp}(t)$ (step 212) and determines whether the measured ACLR is acceptable (i.e., whether the measured ACLR is at or below a defined acceptable ACLR level) (step 214). The acceptable ACLR level may be defined by, e.g., a regulation promulgated by a regulatory agency and may vary from one country or region to another. If the measured ACLR is not at an acceptable level (step 214, NO), the DPD subsystem 22 generates, or updates, the adaptation model based on a comparison of the predistorted baseband transmit signal x'(t) and the normalized receive signal $y_{pp}(t)$, as discussed above (step 216). The process then returns to step 204 and is repeated. Once the ACLR is at an acceptable level (step 214, YES), further updating of the adaptation model ceases, and, in this example, the digital baseband processing system 12 deactivates the receive antenna element 18 and the measurement receiver branch 38 and the process ends (steps 218 and 220).

Figure 7:
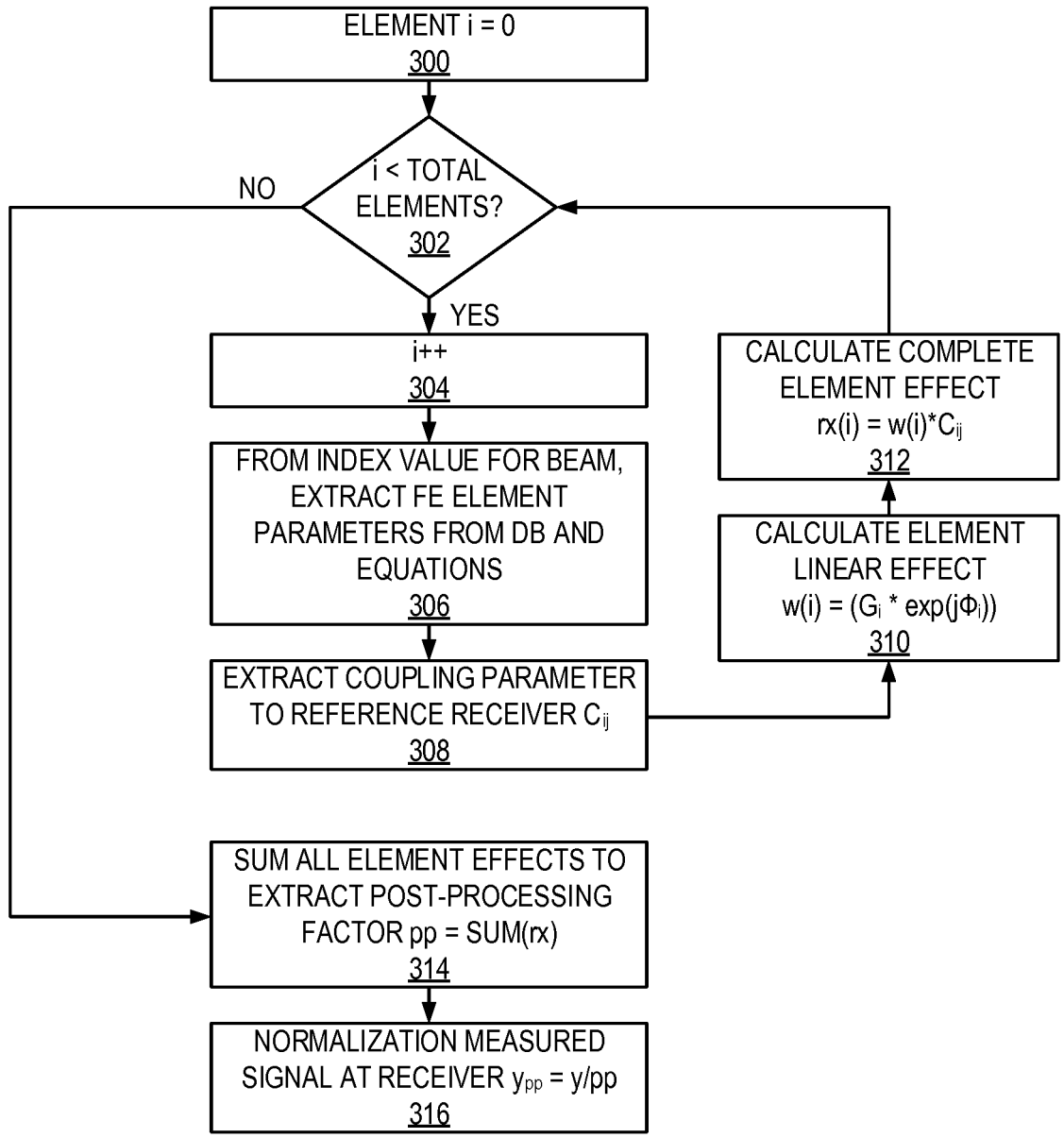
FIG. 7 is a flow chart that illustrates post-processing of a combined receive signal to provide a normalized receive signal according to some embodiments of the present disclosure.

FIG. 7 is a flow chart that illustrates the post-processing step (e.g., step 210 of FIG. 6) in more detail according to some embodiments of the present disclosure. As illustrated, a transmit antenna element index i, which is also the transmitter branch index, is initialized to 0 (step 300). The post-processing function 32 determines whether the index i is less than the total number of active transmit antenna elements 16 (step 302). If so, the post-processing function 32 increments the index i (step 304), extracts the analog beamforming front-end 14 parameters (i.e., gain and phase adjustment values) for the current value of the index i and the current beam settings (e.g., the current beam direction) (step 306) from the database 24, and extracts the coupling factor $C_i$ between the i-th transmit antenna element 16-i and the receive antenna element 18 (referred to here as the j-th antenna element) (step 308).

Next, the post-processing function 32 calculates a linear effect for the i-th transmit antenna element 16-i (step 310). The linear effect w(i) for the i-th transmit antenna element 16-i (i.e., the linear effect w(i) of the i-th transmit branch 36-i) is computed as:

$$w(i) = g_i e^{j\varphi_i}. \quad (5)$$

Note that this weight factor is different for different beam settings (e.g., for different beam directions). The post-processing function 32 then computes a complete effect rx(i) of the i-th antenna element 16-i including the linear effect w(i) and the coupling factor $C_i$ between the i-th transmit antenna element 16-i and the receive antenna element 18, which in this example is denoted as the j-th antenna element such that the coupling factor $C_i$ is denoted as $C_{ij}$ (step 312). The complete effect rx(i) of the i-th transmit antenna element 16-i is computed as:

$$rx(i) = w(i) C_{ij}. \quad (6)$$

Note that the coupling factor $C_{ij}$ can vary with temperature even for the same pair of antenna elements i and j, which leads to different values of the complete effect rx(i). However, all of this information is available in the database 24. The process then returns to step 302 and is repeated until the complete effect rx(i) is computed for each of the transmit antenna elements 16-1 through 16-N.

Once the complete effect rx(i) is computed for each of the transmit antenna elements 16-1 through 16-N, the post-processing function 32 sums all of the complete effects rx(i) (for i=1 ... N) to extract, or determine, a post-processing or normalization factor pp that represents the combined, complete effect for all of the transmit antenna elements 16-1 through 16-N (which can likewise be referred to as the combined, complete effect for all of the transmit branches 36-1 through 36-N) (step 314). The post-processing factor pp is computed as:

$$pp = \sum_{i=1}^{N} rx(i). \quad (7)$$

The post-processing function 32 then computes the normalized baseband receive signal $y_{pp}(t)$ (step 316). The normalized receive signal $y_{pp}(t)$ is computed as:

$$y_{pp}(t) = \frac{y(t)}{pp}. \quad (8)$$

Equation (8) is equivalent to Equation (3) above. Once the normalized baseband receive signal $y_{pp}(t)$ is computed, the DPD subsystem 22 uses the normalized baseband receive signal $y_{pp}(t)$ to generate or update the adaptation model used for predistortion, as described above.

Figure 8:
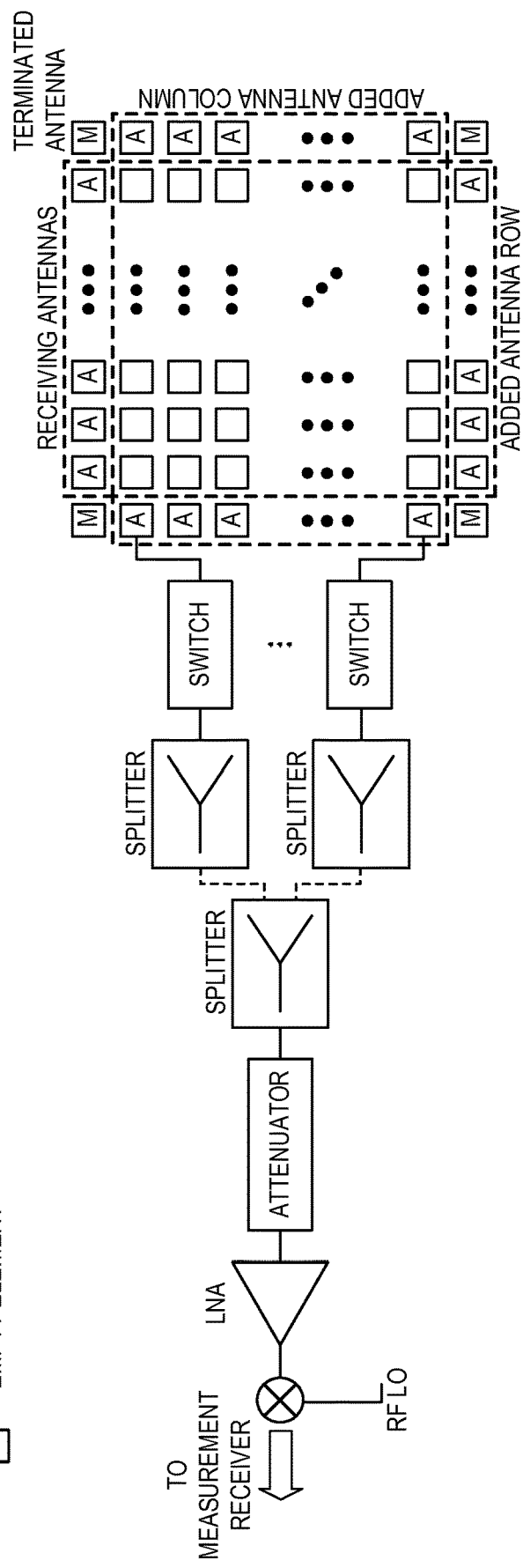
FIG. 8 illustrates one example of an antenna array for an Advanced Antenna System (AAS) in accordance with some embodiments of the present disclosure.

FIG. 8 illustrates one example of the antenna array for the AAS in accordance with some embodiments of the present disclosure. In this example, extra antenna elements are added around the border or periphery of the antenna array, which could be there to have symmetrical coupling between elements that can be used as a receiver. The antenna elements can be combined with a passive combiner and switches. Thus, at minimum, only one LNA is needed. In some embodiments, the LNA follows an Adaptive Gain Control (AGC) attenuator, which may be controlled such that the LNA operates in its linear region and therefore causes minimum distortion. With passive length matching no extra phase tuner is need.

Figure 9:
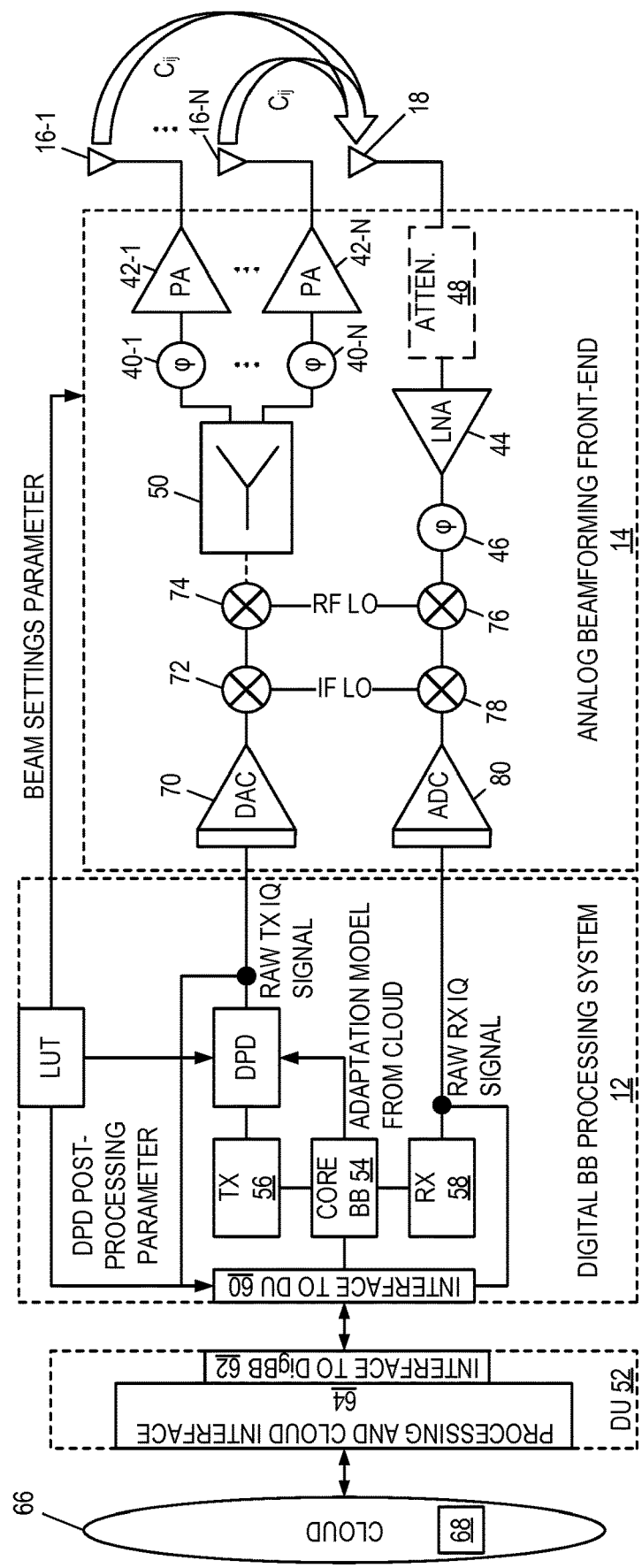
FIG. 9 illustrates another example embodiment of the transceiver system in which some of the functionality of the DPD subsystem is implemented remotely (e.g., "in the cloud")

FIG. 9 illustrates another example embodiment of the transceiver system 10. In this example embodiment, some of the functionality of the DPD subsystem 22 is implemented "in the cloud." As such, this modified version of the DPD subsystem 22 is referred to as DPD subsystem 22'. In particular, in some embodiments, the functionality of the post-processing function 32, the second Volterra series coefficient generator 34, and the adaptation model generator 30 is implemented in the cloud.

As illustrated in FIG. 9, in addition to the digital baseband processing system 12 which may be implemented as, e.g., an ASIC, and the analog beamforming front-end 14 which may be implemented as, e.g., one or more ASICs, the transceiver system 10 include a digital unit 52 that communicatively couples the digital baseband processing system 12 to the cloud. More specifically, the digital baseband processing system 12 additionally includes a core baseband processor 54, a baseband transmit processor 56, a baseband receive processor 58, and an interface 60 to the digital unit 52. The digital unit 52 includes an interface 62 to the digital baseband processing system 12 and a processing and cloud interface block 64 that performs processing for the digital unit 52 and provides an interface to a cloud network 66. The cloud network 66 includes one or more processing nodes 68 on which some of the functionality of the DPD subsystem 22 is implemented. The one or more processing nodes 68 each include, e.g., one or more processors (e.g., one or more CPUs or the like), memory including software executable by the processor(s) to provide the desired functionality, and a network interface(s).

As for the analog beamforming front-end 14, some additional components not illustrated in FIGS. 1, 3, and 5 are illustrated in this example illustration. In particular, a Digital-to-Analog Converter (DAC) 70 and mixers 72 and 74 are shown for digital to analog conversion and upconversion of the predistorted baseband transmit signal prior to processing by the transmitter branches 36-1 through 36-N. In a similar manner, mixers 76 and 78 and an Analog-to-Digital Converter (ADC) 80 are shown for downconversion and analog to digital conversion of the combined receive signal.

The operation of the transceiver system 10 of FIG. 9 is much the same as described above. The baseband transmit signal x(t) is generated (e.g., either at a processing node 68 in the digital unit or in the digital baseband processing system 12) and digitally predistorted by the DPD subsystem 22' based on the adaptation model. The resulting predistorted baseband transmit signal x'(t) is digital to analog converted and upconverted and then transmitted by the transmitter branches 36-1 through 36-N. The respective combined receive signal y(t) is received by the measurement receiver branch 38 and then downconverted and analog to digital converted prior to providing the combined receive signal y(t) to the digital baseband processing system 12. As one example, the digital baseband processing system 12 provides the combined receive signal y(t), the predistorted baseband transmit signal x'(t), and the amplitude, gain, and coupling factors (if the processing node 68 does not already have these values) to the processing node 68 in the cloud network 66 via the digital unit 52. The processing node 68 then performs post-processing as described above to generate the normalized receive signal $y_{pp}(t)$ and then generates or updates the adaptation model for the DPD subsystem 22' based on the normalized receive signal $y_{pp}(t)$ and the predistorted baseband transmit signal x'(t). Additional iterations may be performed to further update the adaptation model.

Figure 10:
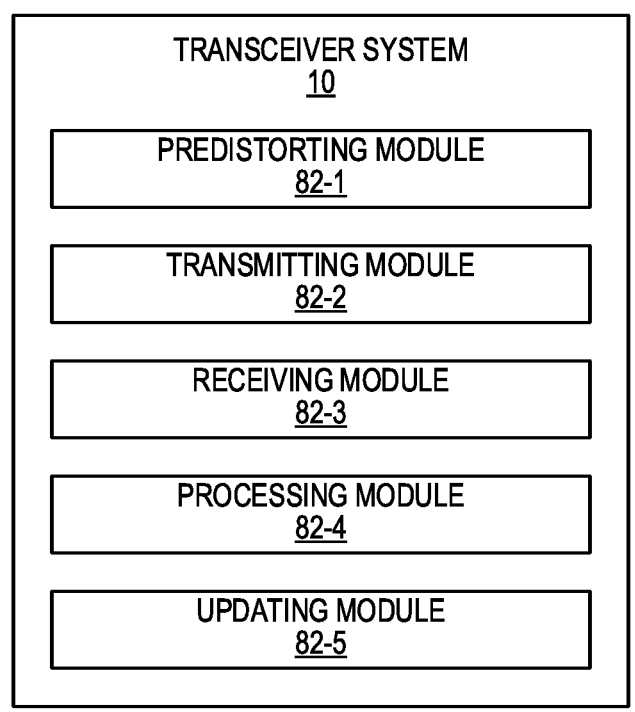
FIG. 10 illustrates the transceiver system according to some other embodiments of the present disclosure.

FIG. 10 illustrates the transceiver system 10 according to some other embodiments of the present disclosure. As illustrated, the transceiver system 10 includes a number of modules 82, each of which is implemented in software. In this example, the modules 82 include a predistorting module 82-1 operable to perform digital predistortion of a baseband transmit signal x(t) based on an adaptation module (e.g., operable to perform steps 202 and 204 of FIG. 6), a transmitting module 82-2 operable to transmit the predistorted baseband transmit signal x'(t) (e.g., operable to perform step 206 of FIG. 6), a receiving module 82-3 operable to receive the combined receive signal y(t) (e.g., operable to perform step 208 of FIG. 6), a processing module 82-4 operable to post-process the combined receive signal y(t) to provide a normalized receive signal $y_{pp}(t)$ (e.g., operable to perform step 210 of FIG. 6), and an updating module 82-5 operable to generate or update the adaptation module based on the normalized receive signal $y_{pp}(t)$ (e.g., operable to perform steps 214 and 216 of FIG. 6).

The following acronyms are used throughout this disclosure.

3GPP Third Generation Partnership Project
5G Fifth Generation
AAS Advanced Antenna System
ACLR Adjacent Channel Leakage-Power Ratio
ADC Analog-to-Digital Converter
AGC Adaptive Gain Control
ASIC Application Specific Integrated Circuit
CPU Central Processing Unit
DAC Digital-to-Analog Converter
dB Decibel
DPD Digital Predistortion
DSP Digital Signal Processor
eNB Enhanced or Evolved Node B
FPGA Field Programmable Gate Array
gNB New Radio Base Station
LNA Low Noise Amplifier
LTE Long Term Evolution
LUT Look Up Table
MIMO Multiple Input Multiple Output
MME Mobility Management Entity
MTC Machine Type Communication
NR New Radio
P1 dB 1 Decibel Compression Point
P-GW Packet Data Network Gateway
SCEF Service Capability Exposure Function
SIMO Single Input Multiple Output
SISO Single Input Single Output
UE User Equipment Those skilled in the art will recognize improvements and modifications to the embodiments of the present disclosure. All such improvements and modifications are considered within the scope of the concepts disclosed herein and the claims that follow.

The invention claimed is:

1. A system comprising:
a digital predistortion subsystem adapted to predistort a baseband transmit signal x(t) based on an adaptation model to thereby provide a predistorted baseband transmit signal x'(t); and
an analog or hybrid beamforming front-end comprising:
a plurality of transmit branches coupled to a plurality of transmit antenna elements, respectively, wherein:
the plurality of transmit branches are adapted to process the predistorted baseband transmit signal x'(t) to transmit a plurality of radio frequency transmit signals $x_{RF,1}(t)$ through $x_{RF,N}(t)$ via the plurality of transmit antenna elements, respectively; and
the plurality of transmit branches apply a plurality of gain adjustments ($g_1$ through $g_N$) and a plurality of phase adjustments ($\varphi_1$ through $\varphi_N$), respectively, such that each radio frequency transmit signal $x_{RF,i}(t)$ of the plurality of radio frequency transmit signals $x_{RF,1}(t)$ through $x_{RF,N}(t)$ is a radio frequency version of the predistorted baseband transmit signal x'(t) having the gain adjustment ($g_i$) and the phase adjustment ($\varphi_i$) applied by the corresponding transmit branch; and
a receive branch coupled to a receive antenna element, the receive branch configured to receive a combined receive signal y(t) comprising the plurality of radio frequency transmit signals $x_{RF,1}(t)$ through $x_{RF,N}(t)$ transmitted via the plurality of transmit antenna elements and received via the receive antenna element;
wherein the digital predistortion subsystem is further adapted to:
process the combined receive signal y(t) based on the plurality of gain adjustments ($g_1$ through $g_N$), the plurality of phase adjustments ($\varphi_1$ through $\varphi_N$), and a plurality of known coupling factors ($C_{1,j}$ through $C_{N,j}$) between the plurality of transmit antenna elements and the receive antenna element, respectively, to thereby provide a normalized receive signal $y_{pp}(t)$; and
update the adaptation model based on a comparison of the normalized receive signal $y_{pp}(t)$ and the predistorted baseband transmit signal x'(t).

2. The system of claim 1 wherein the receive branch comprises:
a low-noise amplifier adapted to amplify the combined receive signal y(t); and
attenuating circuitry adapted to attenuate the combined receive signal y(t) prior to amplification by the low-noise amplifier such that the low-noise amplifier operates in a linear mode.

3. The system of claim 1 wherein, in order to process the combined receive signal y(t) to thereby provide the normalized receive signal $y_{pp}(t)$, the digital predistortion subsystem is further adapted to:
provide the normalized receive signal $y_{pp}(t)$ in accordance with the following equation:

$$y_{pp}(t) = \frac{y(t)}{\sum_{i=1}^{N} g_i e^{j\varphi_i} C_{ij}}$$

where $g_i$ is the gain adjustment applied by the i-th transmit branch, $\varphi_i$ is the phase applied adjustment by the i-th transmit branch and $C_{ij}$ is the coupling factor between the i-th transmit antenna element and the receive antenna element.

4. The system of claim 1 wherein the digital predistortion subsystem is further adapted to:
determine whether a measured Adjacent Channel Leakage-power Ratio, ACLR, is acceptable when using the adaptation model;
update the adaptation model based on a comparison of the normalized receive signal $y_{pp}(t)$ and the predistorted baseband transmit signal $x'(t)$ if the measured ACLR is not acceptable; and
refrain from updating the adaptation model based on a comparison of the normalized receive signal $y_{pp}(t)$ and the predistorted baseband transmit signal $x'(t)$ if the measured ACLR is acceptable.

5. The system of claim 1 wherein the analog or hybrid beamforming front-end is adapted to form a single transmit beam with all of the plurality of transmit antenna elements and the corresponding plurality of transmit branches.

6. The system of claim 1 wherein the plurality of gain adjustments ($g_1$ through $g_N$) are equal.

7. A method for providing digital predistortion in a radio node utilizing an Advanced Antenna System, AAS, comprising a plurality of antenna elements to provide analog or hybrid beamforming, comprising:
predistorting a baseband input signal $x(t)$ based on an adaptation model to thereby provide a predistorted baseband transmit signal $x'(t)$;
transmitting the predistorted baseband transmit signal $x'(t)$ via a plurality of transmit branches coupled to a plurality of transmit antenna elements, respectively, wherein the plurality of transmit branches apply a plurality of gain adjustments ($g_1$ through $g_N$) and a plurality of phase adjustments ($\varphi_1$ through $\varphi_N$), respectively, such that:
a plurality of radio frequency transmit signals $x_{RF,1}(t)$ through $x_{RF,N}(t)$ are transmitted via the plurality of transmit antenna elements, respectively; and
each radio frequency transmit signal $x_{RF,i}(t)$ of the plurality of radio frequency transmit signals $x_{RF,1}(t)$ through $x_{RF,N}(t)$ is a radio frequency version of the predistorted baseband transmit signal $x'(t)$ having the gain adjustment ($g_i$) and the phase adjustment ($\varphi_i$) applied by the corresponding transmit branch;
receiving a combined receive signal $y(t)$ comprising the plurality of radio frequency transmit signals $x_{RF,1}(t)$ through $x_{RF,N}(t)$ transmitted via the plurality of transmit antenna elements and received via a receive antenna element;
processing the combined receive signal $y(t)$ based on the plurality of gain adjustments ($g_1$ through $g_N$), the plurality of phase adjustments ($\varphi_1$ through $\varphi_N$), and a plurality of known coupling factors ($C_{1,j}$ through $C_{N,j}$) between the plurality of transmit antenna elements and the receive antenna element, respectively, to thereby provide a normalized receive signal $y_{pp}(t)$; and
updating the adaptation model based on a comparison of the normalized receive signal $y_{pp}(t)$ and the predistorted baseband transmit signal $x'(t)$.

8. The method of claim 7 wherein receiving the combined receive signal $y(t)$ comprises attenuating the combined receive signal $y(t)$ prior to amplification by a low-noise amplifier such that the low-noise amplifier operates in a linear mode.

9. The method of claim 7 wherein processing the combined receive signal $y(t)$ to thereby provide the normalized receive signal $y_{pp}(t)$ comprises providing the normalized receive signal $y_{pp}(t)$ in accordance with the following equation:

$$y_{pp}(t) = \frac{y(t)}{\sum_{i=1}^{N} g_i e^{j\varphi_i} C_{ij}}$$

where $g_i$ is the gain adjustment applied by the i-th transmit branch, $\varphi_i$ is the phase adjustment applied by the i-th transmit branch, and $C_{ij}$ is the coupling factor between the i-th transmit antenna element and the receive antenna element.

10. The method of claim 7 further comprising:
determining whether a measured Adjacent Channel Leakage-power Ratio, ACLR, is acceptable when using the adaptation model;
wherein:
updating the adaptation model comprises updating the adaptation module based on a comparison of the normalized receive signal $y_{pp}(t)$ and the predistorted baseband transmit signal $x'(t)$ if the measured ACLR is not acceptable; and
the method further comprises refraining from updating the adaptation model based on a comparison of the normalized receive signal $y_{pp}(t)$ and the predistorted baseband transmit signal $x'(t)$ if the measured ACLR is acceptable.

11. The method of claim 7 wherein a single transmit beam is formed with all of the plurality of transmit antenna elements and the corresponding plurality of transmit branches.

12. The method of claim 7 wherein the plurality of gain adjustments ($g_1$ through $g_N$) are equal.

13. A system for providing digital predistortion in a radio node utilizing an Advanced Antenna System, AAS, comprising a plurality of antenna elements to provide analog or hybrid beamforming, the system adapted to:
predistort a baseband input signal $x(t)$ based on an adaptation model to thereby provide a predistorted baseband transmit signal $x'(t)$;
transmit the predistorted baseband transmit signal $x'(t)$ via a plurality of transmit branches coupled to a plurality of transmit antenna elements, respectively, wherein the plurality of transmit branches apply a plurality of gain adjustments ($g_1$ through $g_N$) and a plurality of phase adjustments ($\varphi_1$ through $\varphi_N$), respectively, such that:
a plurality of radio frequency transmit signals $x_{RF,1}(t)$ through $x_{RF,N}(t)$ are transmitted via the plurality of transmit antenna elements, respectively; and
each radio frequency transmit signal $x_{RF,i}(t)$ of the plurality of radio frequency transmit signals $x_{RF,1}(t)$ through $x_{RF,N}(t)$ is a radio frequency version of the predistorted baseband transmit signal $x'(t)$ having the gain adjustment ($g_i$) and the phase adjustment ($\varphi_i$) applied by the corresponding transmit branch;
receive a combined receive signal $y(t)$ comprising the plurality of radio frequency transmit signals $x_{RF,1}(t)$ through $x_{RF,N}(t)$ transmitted via the plurality of transmit antenna elements and received via a receive antenna element;
process the combined receive signal $y(t)$ based on the plurality of gain adjustments ($g_1$ through $g_N$), the plurality of phase adjustments ($\varphi_1$ through $\varphi_N$), and a plurality of known coupling factors ($C_{1,j}$ through $C_{N,j}$) between the plurality of transmit antenna elements and the receive antenna element, respectively, to thereby provide a normalized receive signal $y_{pp}(t)$; and update the adaptation model based on a comparison of the normalized receive signal $y_{pp}(t)$ and the predistorted baseband transmit signal $x'(t)$.

\* \* \* \* \*